(12) United States Patent
Jung et al.

(10) Patent No.: US 8,852,982 B2
(45) Date of Patent: Oct. 7, 2014

(54) PHOTOELECTRIC DEVICE AND MANUFACTURING METHOD THEREOF

(71) Applicant: Samsung SDI Co., Ltd., Yongin-si (KR)

(72) Inventors: June-Hyuk Jung, Yongin-si (KR); Young-Soo Kim, Yongin-si (KR); Sung-Chul Lee, Yongin-si (KR); Jae-Ho Shin, Yongin-si (KR); Dong-Hun Lee, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/838,643

(22) Filed: Mar. 15, 2013

(65) Prior Publication Data
US 2014/0015087 A1    Jan. 16, 2014

(30) Foreign Application Priority Data

Jul. 11, 2012   (KR) .......................... 10-2012-0075741

(51) Int. Cl.
*H01L 21/00*   (2006.01)
*H01L 31/18*   (2006.01)
*H01L 31/0248*   (2006.01)

(52) U.S. Cl.
CPC ............ *H01L 31/0248* (2013.01); *H01L 31/18* (2013.01)
USPC ................ 438/48; 257/458; 438/71; 136/256

(58) Field of Classification Search
USPC ..................... 257/458; 438/48, 71; 136/256
See application file for complete search history.

(56) References Cited

U.S. PATENT DOCUMENTS

| 7,339,110 | B1 | 3/2008 | Mulligan et al. | |
| 2009/0223562 | A1* | 9/2009 | Niira et al. ................ | 136/256 |
| 2009/0283800 | A1 | 11/2009 | Im et al. | |
| 2009/0305456 | A1 | 12/2009 | Funakoshi | |
| 2010/0267187 | A1 | 10/2010 | Funakoshi | |
| 2011/0303280 | A1* | 12/2011 | Pawlak et al. ............. | 136/256 |
| 2012/0045866 | A1* | 2/2012 | Mathew et al. ............ | 438/68 |

FOREIGN PATENT DOCUMENTS

| JP | 2010-16130 A | 7/2010 |
| KR | 10-0611753 B | 8/2006 |
| KR | 10-0623686 B | 9/2006 |
| KR | 2008-0105280 A | 12/2008 |

OTHER PUBLICATIONS

B. Schwartz and H. Robbins, Chemical Etching of Silicon : IV. Etching Technology, Journal of the electochemical society, Dec. 1976, 1903-1909 pp., vol. 123, issue 12, The Electrochemical Society.

* cited by examiner

*Primary Examiner* — David Vu
*Assistant Examiner* — Brandon Fox
(74) *Attorney, Agent, or Firm* — Knobbe Martens Olson & Bear LLP

(57) ABSTRACT

A photoelectric device is disclosed. The photoelectric device includes a semiconductor substrate, first and second semiconductor stacks having opposite conductive types and alternately arranged on a first surface of the semiconductor substrate, and a gap insulation layer formed between the first and second semiconductor stacks. An undercut may be formed in the gap insulation layer. A method of manufacturing a photoelectric device is also disclosed.

14 Claims, 14 Drawing Sheets

PHOTOELECTRIC DEVICE AND MANUFACTURING METHOD THEREOF

CROSS-REFERENCE TO RELATED APPLICATIONS

This application claims the benefit of Korean Patent Application No. 10-2012-0075741 filed on Jul. 11, 2012 in the Korean Intellectual Property Office, the disclosure of which is incorporated herein by reference in its entirety.

BACKGROUND

1. Field

One or more embodiments of the present disclosure relate to a photoelectric device and a manufacturing method thereof.

2. Description of the Related Technology

Recently, as fossil fuel energy resources are depleted and there are increased concerns over energy pollution from existing fuel sources, there is also an increase in the development of clean energy sources and methods. One new clean energy source is based upon light from the sun, which may be directly converted to electricity by solar cells.

During manufacturing of a solar cell, wet etching or dry etching may be used as part of a semiconductor layer patterning process. One advantage of wet etching is that it does not require expensive special equipment. One advantage of dry etching, such as reactive ion etching (RIE), is that it may be widely used. However, it requires expensive special equipment, and thus a high-energy ion bombardment, which thereby increases overall manufacturing costs.

SUMMARY OF CERTAIN INVENTIVE ASPECTS

In a first aspect, a photoelectric device that may activate etching reaction during wet etching is provided.

In another aspect, a photoelectric device may include, for example, a semiconductor substrate, first and second semiconductor stacks having opposite conductive types and alternately arranged on a first surface of the semiconductor substrate, a gap insulation layer formed between the first and second semiconductor stacks, and an undercut formed in the gap insulation layer.

In some embodiments, when the gap insulation layer includes a bottom surface facing the first surface of the semiconductor substrate and left and right side surfaces connected to the bottom surface, the undercut may be formed in any of the left and right side surfaces. In some embodiments, end portions of the first and second semiconductor stacks may be formed to cover a side surface and part of an upper surface of the gap insulation layer. In some embodiments, a capping layer may be formed on a second surface of the semiconductor substrate that is opposite to the first surface. In some embodiments, the capping layer may include an insulation layer having electrical insulation. In some embodiments, the capping layer may include at least one of a silicon oxide layer and a silicon nitride layer. In some embodiments, the capping layer may be formed on a texture structure formed on the second surface of the semiconductor substrate. In some embodiments, the first semiconductor stack may include a first intrinsic semiconductor layer formed on the first surface of the semiconductor substrate, a first conductive semiconductor layer formed on the first intrinsic semiconductor layer, and a first transparent conductive layer formed on the first conductive semiconductor layer. In some embodiments, the second semiconductor stack may include a second intrinsic semiconductor layer formed on the first surface of the semiconductor substrate, a second conductive semiconductor layer formed on the second intrinsic semiconductor layer, and a second transparent conductive layer formed on the second conductive semiconductor layer.

In another aspect, a method of manufacturing a photoelectric device may include, for example, preparing a semiconductor substrate having first and second surfaces that are opposite to each other, forming a capping layer on the second surface of the semiconductor substrate, forming a first semiconductor stack material layer on the first surface of the semiconductor substrate, and forming a first semiconductor stack by patterning the first semiconductor stack material layer by wet etching.

In some embodiments, the forming of the capping layer may be performed before the forming of the first semiconductor stack. In some embodiments, the first semiconductor stack material layer may include a first conductive semiconductor layer doped to have p-type conductivity. In some embodiments, the capping layer may include an insulation layer having electric insulation. In some embodiments, an etching solution of a combination of hydrofluoric acid (HF), nitric acid (HNO3), and pure water (DI water) or an etching solution of a combination of hydrofluoric acid (HF), nitric acid (HNO3), and acetic acid ($CH_3COOH$) may be used in the wet etching. In some embodiments, the method may further include forming a gap insulation layer on the first surface of the semiconductor substrate. In some embodiments, the first semiconductor stack material layer covers part of the gap insulation layer. In some embodiments, the method may further include forming a second semiconductor stack material layer on the first surface of the semiconductor substrate where the first semiconductor stack is formed, and forming a second semiconductor stack by patterning the second semiconductor stack material layer by wet etching. In some embodiments, the first and second semiconductor stacks may be respectively formed on first and second semiconductor areas that do not overlap.

Additional aspects will be set forth in part in the description which follows and, in part, will be apparent from the description, or may be learned by practice of the presented embodiments.

BRIEF DESCRIPTION OF THE DRAWINGS

These and/or other aspects will become apparent and more readily appreciated from the following drawings, which taken in conjunction with the Detailed Description of Certain Inventive Embodiments section and other sections of the present application, serve to explain the principles of the present disclosure.

DETAILED DESCRIPTION OF CERTAIN INVENTIVE EMBODIMENTS

Figure 1:
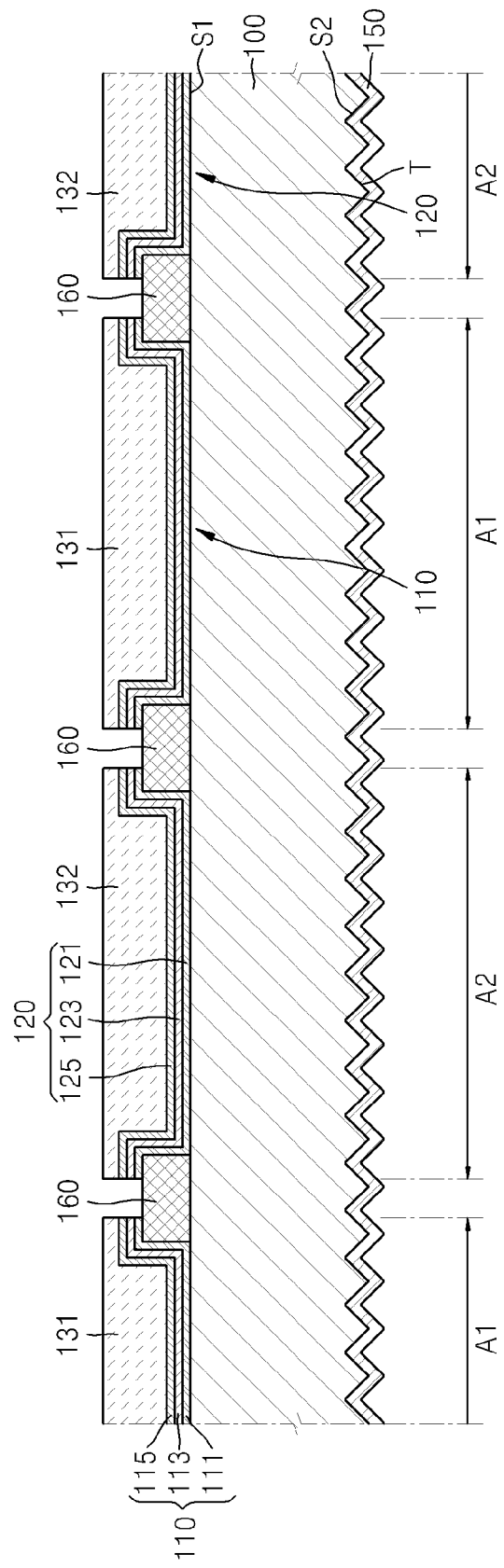
FIG. 1 is a cross-sectional view of a photoelectric device according to an embodiment of the present disclosure.

In the following detailed description, only certain exemplary embodiments have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" another element, it can be directly connected to the another element or be indirectly connected to the another element with one or more intervening elements interposed therebetween. Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. As used herein, the term "and/or" includes any and all combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of," when preceding a list of elements, modify the entire list of elements and do not modify the individual elements of the list.

FIG. 1 is a cross-sectional view of a photoelectric device according to an embodiment of the present disclosure. Referring to FIG. 1, the photoelectric device includes a semiconductor substrate 100, a first semiconductor stack 110 of a first conductive type and a second semiconductor stack 120 of a second conductive type that are formed on the semiconductor substrate 100, and first and second electrodes 131 and 132, respectively. The first and second electrodes 131 and 132 are also electrically connected to the first and second semiconductor stacks 110 and 120, respectively. For example, the first and second semiconductor stacks 110 and 120 may be alternately arranged on the semiconductor substrate 100 in plural.

The semiconductor substrate 100 may include a first surface S1 and a second surface S2 opposite to the first surface S1. For example, back-contact that electrodes of an emitter and a base, for example, the first and second electrodes 131 and 132, are all formed on the first surface S1. Also, when the second surface S2 with no electrode structure functions as a light-receiving surface, effective incident light may be increased and light loss may be reduced. For example, by forming a back-contact in which no electrode is formed on a light-receiving surface of the semiconductor substrate 100, light loss due to electrode surface area may be reduced. Also, compared with a conventional solar cell, a higher output may be obtained.

For example, the semiconductor substrate 100 may generate photogenerated carriers by receiving light through the second surface S2. The photogenerated carriers (hereinafter, referred to as carriers) signify holes and electrons generated by being absorbed in the semiconductor substrate 100. The semiconductor substrate 100 may be formed as a monocrystal silicon substrate or polycrystal silicon substrate having n-type or p-type conductivity. For example, in the present embodiment, the semiconductor substrate 100 may be formed as an n-type monocrystal silicon substrate. A texture structure T including an uneven pattern may be formed on the second surface S2 of the semiconductor substrate 100. The texture structure T may reduce reflectance of incident light and form an uneven surface including a plurality of fine protrusions. The texture structure T may include a wave shape, an uneven pattern shape, a gentle curve shape, a scalloped shape or a jagged shape.

A capping layer 150 may be formed on the second surface S2 of the semiconductor substrate 100. The capping layer 150 may entirely cover the second surface S2 of the semiconductor substrate 100 and may reduce etching reaction at the second surface S2 and activate etching reaction at the first surface S1. Accordingly, of the first surface S1 of the semiconductor substrate 100, the first semiconductor stack 110 may be selectively patterned in a first semiconductor area A1 and the second semiconductor stack 120 may be selectively patterned in a second semiconductor area A2, which is described below in detail.

The capping layer 150 may be formed of an insulation material, for example, may include an insulation material having a band gap between a conduction band and a valence band that is equal to or more than 3.0 eV, to thus form an electric potential barrier on the second surface S2 of the semiconductor substrate 100. In detail, the capping layer 150 may include a silicon oxide (SiOx) layer or a silicon nitride (SiNx) layer. The capping layer 150 may be formed of a material having a work function of 5.0 eV or less.

The capping layer 150 may be formed in the form of a single layer or a combined layer of two or more layers. For example, the capping layer 150 may be formed in the form of a single layer of silicon oxide or silicon nitride, or a combined layer of silicon oxide and silicon nitride.

The capping layer 150 may also have a passivation function of the second surface S2 of the semiconductor substrate 100. That is, the capping layer 150 prevents surface recombination of the carriers generated in the semiconductor substrate 100 to improve carrier collection efficiency. For example, the capping layer 150 may reduce recombination loss according to a surface defect of the semiconductor substrate 100 and improve carrier collection efficiency. Also, the capping layer 150 may be formed on the second surface S2 that is a light-receiving surface of the semiconductor substrate 100 and may additionally have an antireflection function to reduce light reflectance and improve a light absorption rate. The capping layer 150 may include an uneven unpatterned surface shape, a wave shape, an uneven pattern shape, a gentle curve shape, a scalloped shape or a jagged shape.

For example, by forming a hydrogenated silicon nitride (SiN:H) layer as the capping layer 150, an etching barrier is formed at the second surface S2 of the semiconductor substrate 100 and simultaneously passivation and antireflection effects of the second surface S2 may be obtained.

In another embodiment of the present disclosure, the capping layer 150 may be formed in the form of a combined layer of a first layer (not shown) with a passivation function and a second layer (not shown) with an antireflection function, in addition to the forming of an etching barrier at the second surface S2 of the semiconductor substrate 100.

In another embodiment of the present disclosure, a passivation layer (not shown) and/or an antireflection layer (not shown) may be additionally formed on the capping layer 150 of the semiconductor substrate 100, as a separate layer structure.

The first and second semiconductor stacks 110 and 120 having opposite conductive types may be formed on the first surface S1 of the semiconductor substrate 100. For example, the first and second semiconductor stacks 110 and 120 may be alternately arranged on the first surface S1 of the semiconductor substrate 100. The first and second semiconductor stacks 110 and 120 may respectively form an emitter and a base for separating and collecting the carriers generated in the semiconductor substrate 100. The first and second semiconductor stacks 110 and 120 may be selectively formed in the first and second semiconductor areas A1 and A2 of the first surface S1 of the semiconductor substrate 100, respectively.

The first semiconductor stack 110 may include a first intrinsic semiconductor layer 111 and a first conductive semiconductor layer 113 sequentially deposited in this order on the semiconductor substrate 100. The first intrinsic semiconductor layer 111 and the first conductive semiconductor layer 113 may be formed of amorphous silicon (a-Si) or microcrystal silicon (μc-Si).

The first intrinsic semiconductor layer 111 may be formed by adding no dopant or adding a small amount of dopant. For example, the first intrinsic semiconductor layer 111 may passivate the semiconductor substrate 100 to prevent recombination of the carriers generated in the semiconductor substrate 100, and thus, an interface characteristic between the semiconductor substrate 100 of crystal silicon and the first conductive semiconductor layer 113 of a-Si may be improved.

The first conductive semiconductor layer 113 may be formed by adding a p-type or n-type dopant. For example, the first conductive semiconductor layer 113 may be doped with a p-type dopant to be opposite type to the semiconductor substrate 100 that is of an n-type and may form an emitter for collecting minority carriers, for example, holes, from the n-type semiconductor substrate 100.

The first semiconductor stack 110 may further include a first transparent conductive layer 115 formed on the first conductive semiconductor layer 113. The first transparent conductive layer 115 may be electrically conductive and may include an optically transparent material. For example, the first transparent conductive layer 115 may be formed of transparent conducting oxide (TCO) such as indium tin oxide (ITO), zinc oxide (ZnO), or the like. For example, the first transparent conductive layer 115 interfaces or includes an electrical connection between the first conductive semiconductor layer 113 and the first electrode 131 and may reduce contact resistance therebetween.

The second semiconductor stack 120 may include a second intrinsic semiconductor layer 121 and a second conductive semiconductor layer 123 sequentially deposited in this order on the semiconductor substrate 100. The second intrinsic semiconductor layer 121 and the second conductive semiconductor layer 123 may be formed of a-Si or μc-Si, respectively.

The second intrinsic semiconductor layer 121 may be formed without adding dopant or merely adding a relatively small amount of dopant. For example, the second intrinsic semiconductor layer 121 may passivate a surface of the semiconductor substrate 100 to prevent recombination of the carriers generated in the semiconductor substrate 100, and thus, an interface characteristic between the semiconductor substrate 100 of crystal silicon and the second conductive semiconductor layer 123 of a-Si may be improved.

The second conductive semiconductor layer 123 may be formed by adding an n-type or p-type dopant. For example, the second conductive semiconductor layer 123 may be doped with an n-type dopant like the semiconductor substrate 100 that is of an n-type and may form a base for collecting majority carriers, for example, electrons, from the n-type semiconductor substrate 100.

The second semiconductor stack 120 may further include a second transparent conductive layer 125 formed on the second conductive semiconductor layer 123. The second transparent conductive layer 125 may be electrically conductive and may include an optically transparent material. For example, the second transparent conductive layer 125 may be formed of TCO such as ITO, ZnO, or the like. For example, the second transparent conductive layer 125 interfaces or includes an electrical connection between the second conductive semiconductor layer 123 and the second electrode 132 and may reduce contact resistance therebetween.

In the embodiment of FIG. 1, the first and second semiconductor stacks 110 and 120 form an emitter and a base respectively including the first and second intrinsic semiconductor layers 111 and 121 and the first and second conductive semiconductor layers 113 and 123. In another embodiment, the first and second semiconductor stacks 110 and 120 may respectively include the first and second conductive semiconductor layers 113 and the 123 only, without the first and second intrinsic semiconductor layers 111 and 121.

In the embodiment of FIG. 1, the first and second semiconductor stacks 110 and 120 respectively include the first and second transparent conductive layers 115 and 125 interfacing or including the electrical connection between the first and second electrodes 131 and 132. In another embodiment, the first and second transparent conductive layers 115 and 125 are not formed. For example, the first and second electrodes 131 and 132 may be formed directly on the first and second semiconductor stacks 110 and 120 without the first and second transparent conductive layers 115 and 125 therebetween.

The first and second electrodes 131 and 132 may be formed on the first and second semiconductor stacks 110 and 120, respectively. The first and second electrodes 131 and 132 may be electrically connected to the first and second semiconductor stacks 110 and 120, respectively, and be configured to draw the photogenerated carriers to the outside.

The first and second electrodes 131 and 132 may include a metal material such as silver (Ag), aluminum (Al), copper (Cu), nickel (Ni), and the like. The first and second electrodes 131 and 132 form a current path for a photocurrent and may be formed of a metal material exhibiting superior electric conductivity to reduce a serial resistance. For easy understanding, in FIG. 1, the shapes of the first and second electrodes 131 and 132 are illustrated in a widthwise direction. In contrast, the first and second electrodes 131 and 132 may be formed in strips in a current draw direction.

A gap insulation layer 160 may be formed between the first and second semiconductor stacks 110 and 120. The gap insulation layer 160 may cover a portion between the first and second semiconductor stacks 110 and 120, may passivate a surface of the semiconductor substrate 100 exposed between the first and second semiconductor stacks 110 and 120, and may be formed to secure insulation between the first and second semiconductor stacks 110 and 120. For example, end portions of the first and second semiconductor stacks 110 and 120 may be formed to cover part of the gap insulation layer 160. The gap insulation layer 160 may be formed of an oxide layer (SiOx) or a nitride layer (SiNx).

The first and second semiconductor stacks 110 and 120 are respectively formed in the first and second semiconductor areas A1 and A2 of the semiconductor substrate 100. In other words, the first semiconductor stack 110 may be selectively formed in the first semiconductor area A1, whereas the second semiconductor stack 120 may be selectively formed in the second semiconductor area A2.

The first semiconductor stack 110 may be formed by patterning a material layer formed over the entire first surface S1 of the semiconductor substrate 100. For example, among the material layer of the first intrinsic semiconductor layer 111, the first conductive semiconductor layer 113, and the first transparent conductive layer 115 formed on the semiconductor substrate 100, the first semiconductor stack 110 locally formed in the first semiconductor area A1 may be obtained by selectively etching away the material layer in the other area than the first semiconductor area A1.

Wet etching may be used when patterning to form first semiconductor stack 110. A mixed solution of Hydrofluoric acid+Nitric Acid+Acetic acid (HNA) of nitric acid ($HNO_3$), hydrofluoric acid (HF), and acetic acid ($CH_3COOH$), or nitric acid ($HNO_3$), hydrofluoric acid (HF), and pure water (DI water) may be used as an etchant.

Unlike dry etching, wet etching is advantageous for mass production and has a relatively low manufacturing cost. By wet etching in the patterning of the semiconductor substrate 100, mass productivity of a photoelectric device may be improved and manufacturing costs may be reduced. For example, reactive ion etching (RIE), which is a type of dry etching, requires expensive special equipment and a high-energy ion bombardment is incurred, thereby increasing overall manufacturing costs.

Figure 2A:
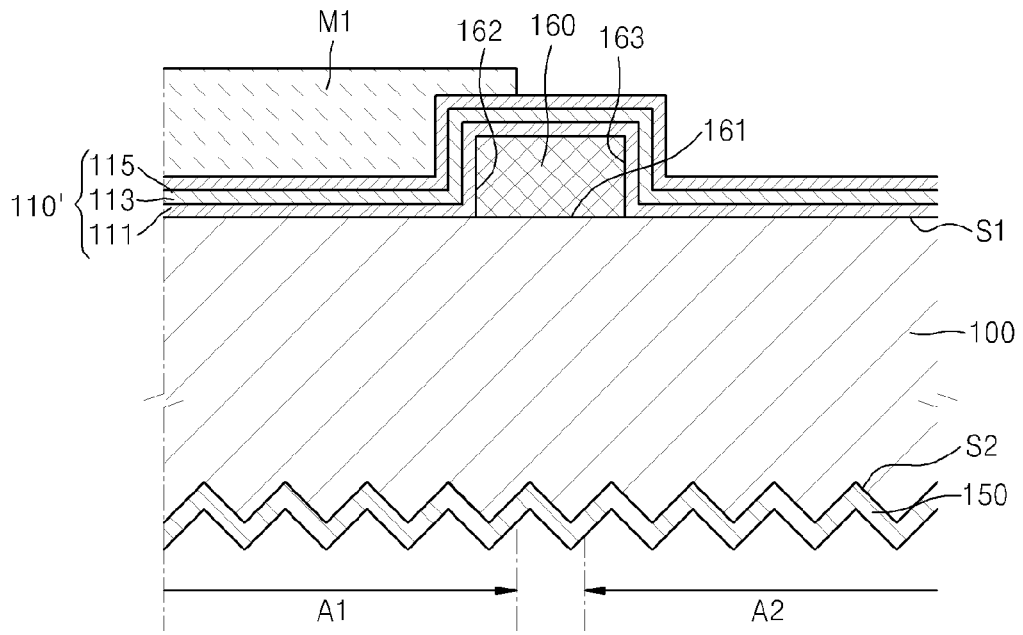
FIGS. 2A and 2B are cross-sectional views for explaining wet etching of a first semiconductor stack, respectively illustrating shapes before and after wet etching.
Figure 2B:
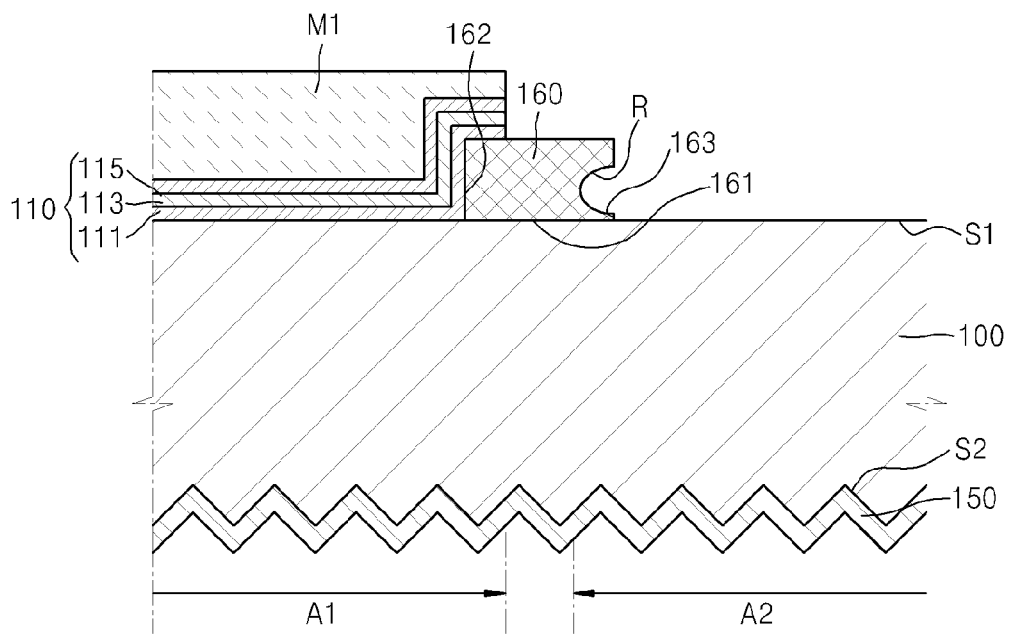

FIGS. 2A and 2B are cross-sectional views for illustrating wet etching of the first semiconductor stack 110, respectively illustrating shapes before and after wet etching. Referring to FIG. 2A, the first intrinsic semiconductor layer 111, the first conductive semiconductor layer 113, and the first transparent conductive layer 115 are formed over the entire first surface S1 of the semiconductor substrate 100, that is, the entire first surface S1 including the gap insulation layer 160, thereby forming a first semiconductor stack material layer 110'. Then, the first semiconductor stack material layer 110' in the other area than the first semiconductor area A1 is removed by using an etch mask M1 to form the first semiconductor stack 110.

As illustrated in FIG. 2A, in the wet etching using a solution etchant such as HNA, since anisotropic etching having no etching directivity or etching close to anisotropy is performed, an undercut R occurs at a side surface of the gap insulation layer 160.

For example, the gap insulation layer 160 has a bottom surface 161 contacting the semiconductor substrate 100 and left and right side surfaces 162 and 163 connected to the bottom surface 161. The undercut R may be formed in any one of the left and right side surfaces 162 and 163, that is, a side surface exposed by the etch mask M1, for example, the right side surface 163.

Figure 3A:
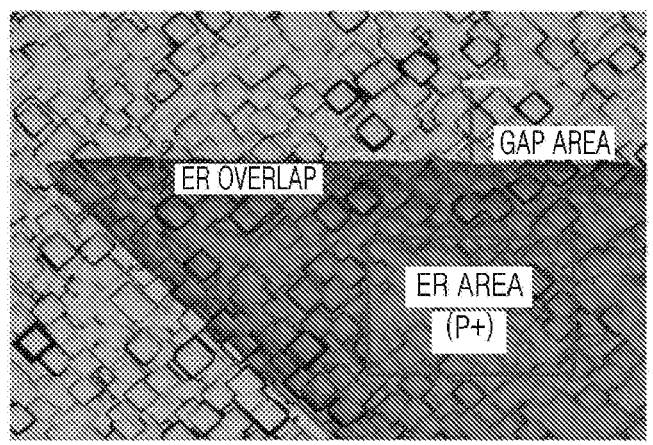
FIGS. 3A and 3B are images illustrating an undercut of a gap insulation layer.
Figure 3B:
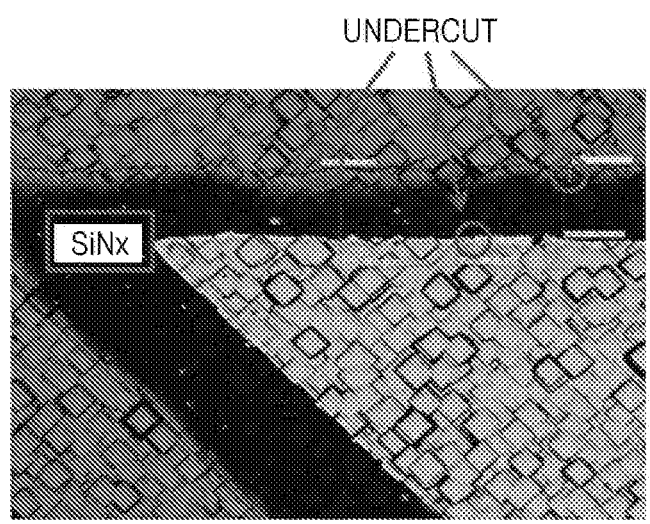

FIGS. 3A and 3B are images illustrating the undercut of the gap insulation layer 160. FIG. 3A illustrates an area where the gap insulation layer 160 is formed (Gap area), an area where the etch mask M1 is formed (ER area), and an area where the gap insulation layer 160 and the etch mask M1 overlap (ER overlap). FIG. 3B illustrates that the undercut is formed in the gap insulation layer 160 (SiNx).

The undercut may be uniquely formed via wet etching. For example, in the RIE, a kind of dry etching, ion bombardment with directivity is used and thus no undercut occurs in the side surface of the gap insulation layer 160.

As seen in FIG. 2A, the capping layer 150 is formed on the second surface S2 of the semiconductor substrate 100 before the wet etching of the first semiconductor stack material layer 110'. The capping layer 150 is formed on the second surface S2 that is opposite to the first surface S1 where the first semiconductor stack material layer 110' is formed. The capping layer 150 may thus be configured to prevent a reaction between an etching solution and the second surface S2 of the semiconductor substrate 100 and may prevent leakage of electrons through the second surface S2 by forming an electric potential barrier on the second surface S2. Accordingly, a sufficient number of electrons that participate in the etching reaction of the first semiconductor stack material layer 110' may be secured, and thus, etching may be activated.

In the wet etching of the first semiconductor stack 110, an acid solution, for example, HNA, may be employed. In the first semiconductor stack 110, the first conductive semiconductor layer 113 doped to have p-type conductivity has a relatively low etching rate due to the lack of electrons that participate in the etching reaction, which is a hindrance factor that restricts the etching of the first semiconductor stack 110. Thus, the following description focuses on the first semiconductor stack 110, particularly, the etching of the first conductive semiconductor layer 113.

HNA provides $NO_2$ that is a strong oxidizing agent of silicon, and the $NO_2$ receives electrons from a surface of silicon to oxidize the silicon. The oxidized silicon reacts with a hydroxyl group ($OH^-$) to produce a soluble material and is removed by being dissolved. The series of reactions may be summarized as follows:

$$2NO_2 + Si \rightarrow 2NO_2{-} + Si_2{+} \quad (1)$$

$$Si_2{+} + 2OH{-} \rightarrow SiO_2 + H_2 \quad (2)$$

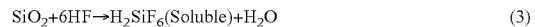

$$SiO_2 + 6HF \rightarrow H_2SiF_6(\text{Soluble}) + H_2O \quad (3)$$

The series of etching processes may be performed on the first conductive semiconductor layer 113 exposed to the etching solution or the second surface S2 of the semiconductor substrate 100 opposite to the first conductive semiconductor layer 113. In other words, the silicon in the reactions (1) and (2) may correspond to the silicon of the first conductive semiconductor layer 113 or the silicon of the semiconductor substrate 100.

Figure 4A:
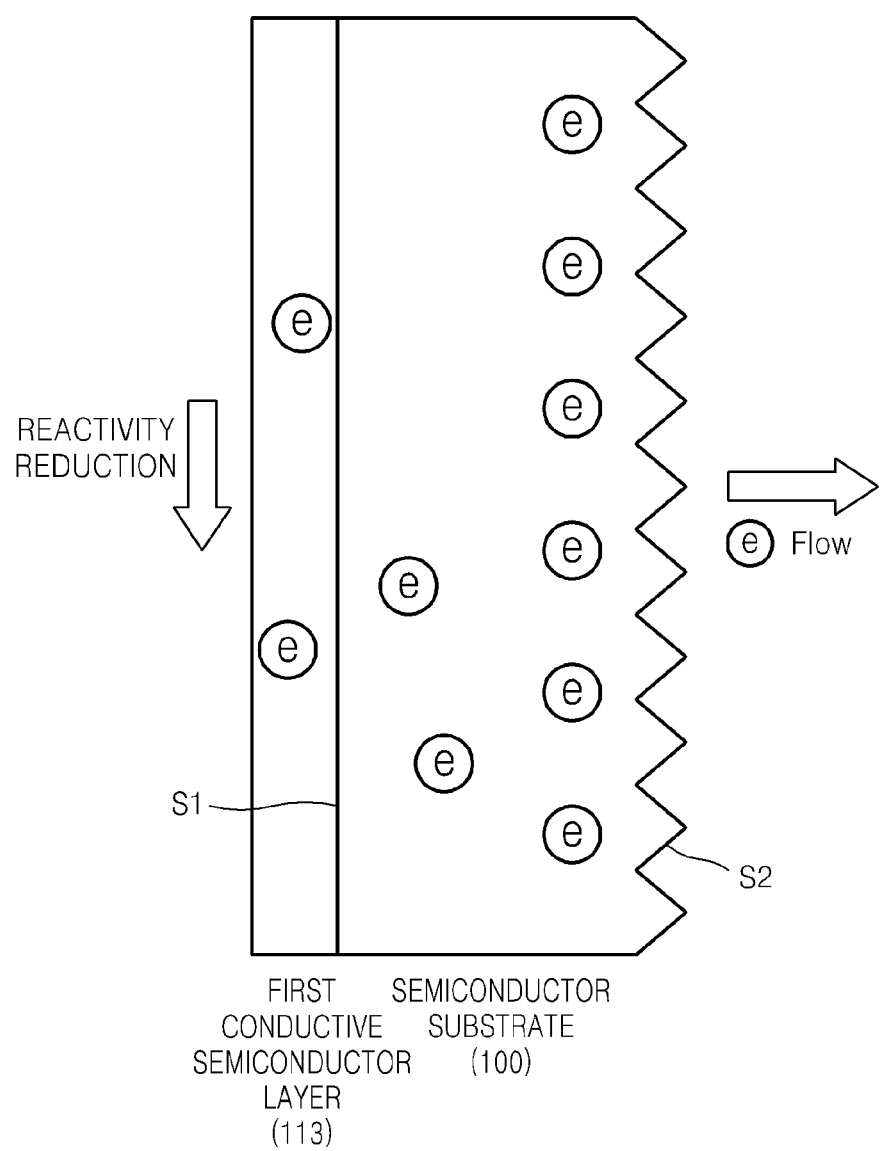
FIGS. 4A and 4B are views for explaining wet etching of a first conductive semiconductor layer, schematically illustrating a distribution of electrons in a semiconductor substrate where the first conductive semiconductor layer is formed.
Figure 4B:
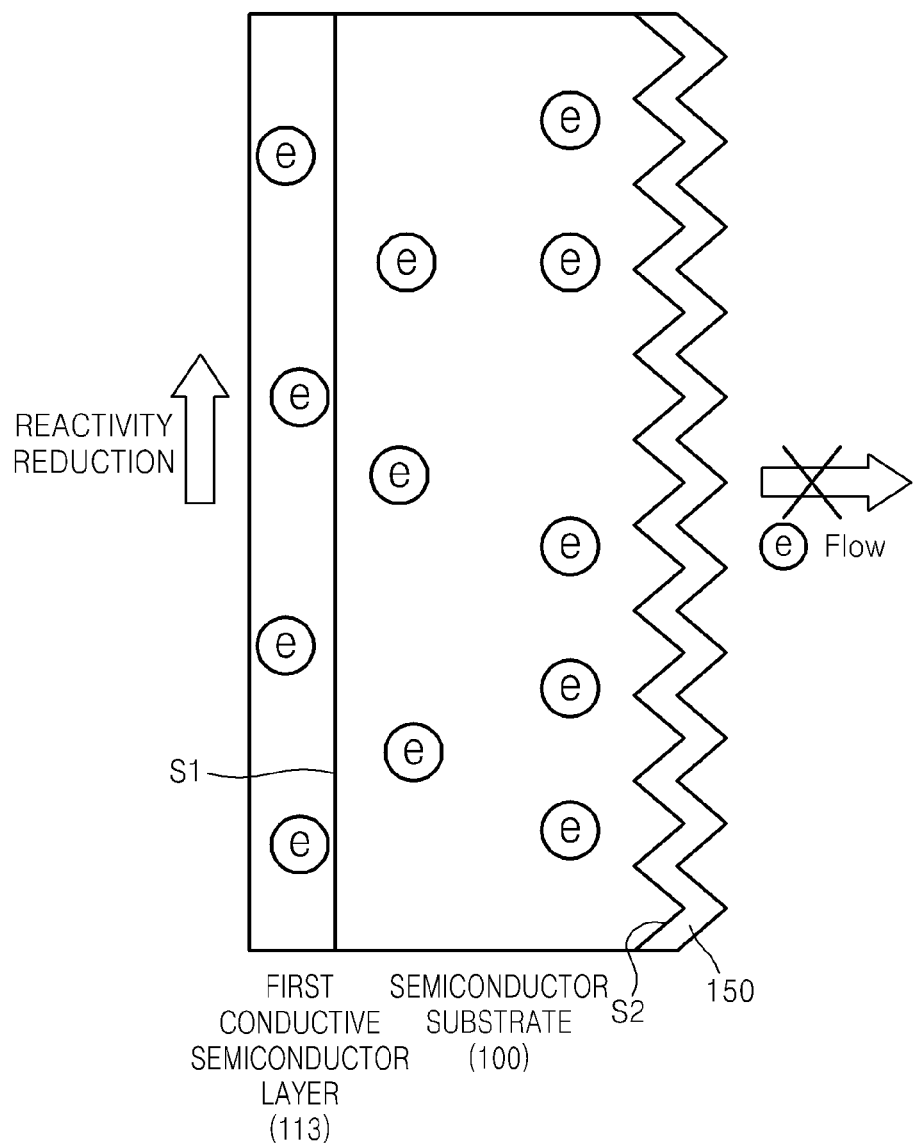

FIGS. 4A and 4B are views illustrating wet etching of the first conductive semiconductor layer 113, and schematically illustrating a distribution of electrons in the semiconductor substrate 100 where the first conductive semiconductor layer 113 is formed. FIGS. 4A and 4B illustrate distributions of electrons before and after the forming of the capping layer 150, respectively. In FIGS. 4A and 4B, "ⓔ" indicates an electron.

Referring to FIG. 4A, the second surface S2 of the semiconductor substrate 100 shows a relatively high electron density, whereas the first surface S1 of the semiconductor substrate 100, that is, the first conductive semiconductor layer 113, shows a relatively low electron density. This distribution of electrons shows that electrons move toward the semiconductor substrate 100, that is, the second surface S2 of the semiconductor substrate 100, according to an electric field of a p-n junction between the n-type doped semiconductor substrate 100 and the p-type doped first conductive semiconductor layer 113.

Figure 5A:
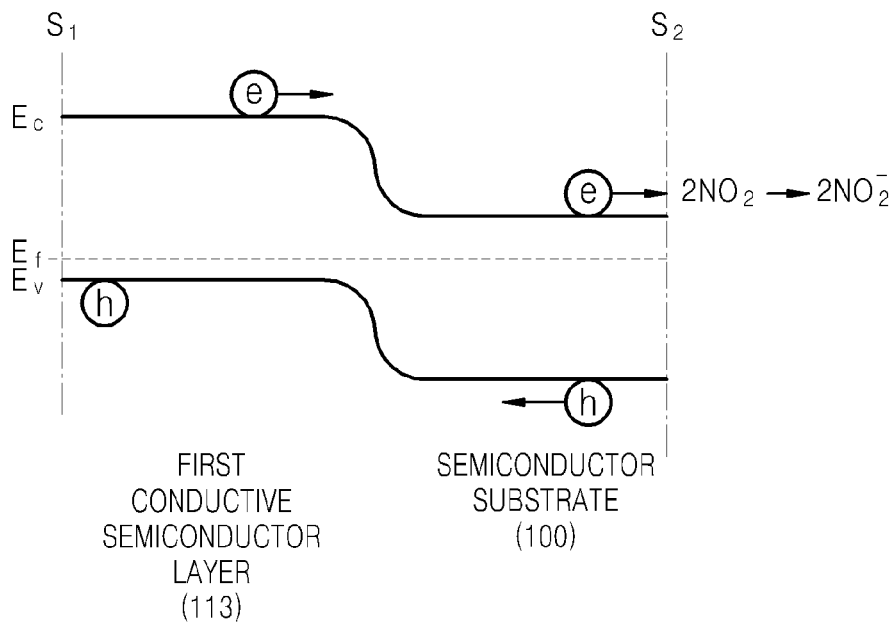
FIGS. 5A and 5B are energy band diagrams at an interface between the first conductive semiconductor layer and the semiconductor substrate.
Figure 5B:
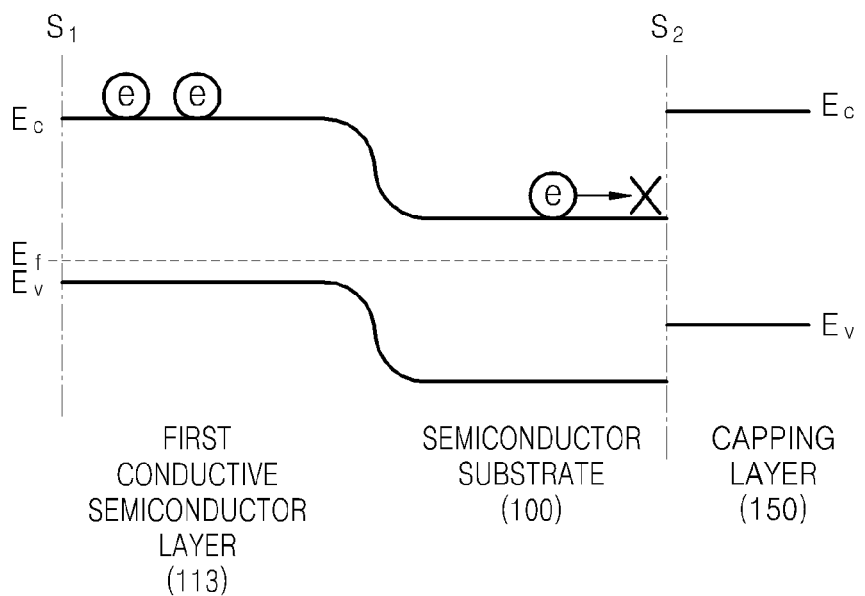

FIGS. 5A and 5B are energy band diagrams at an interface between the first conductive semiconductor layer 113 and the semiconductor substrate 100. FIGS. 5A and 5B illustrate energy band diagrams before and after the forming of the capping layer 150, respectively. In FIGS. 5A and 5B, "(e)" and "(h)", respectively, indicate an electron and a hole. Ec, Ef, and Ev respectively denote a conduction band, a Fermi level, and a valence band.

Referring to FIG. 5A, an internal electric field is formed between the n-type doped semiconductor substrate 100 and the p-type doped first conductive semiconductor layer 113 according to a p-n junction. Electrons move toward the semiconductor substrate 100, that is, the second surface S2 of the semiconductor substrate 100, along the internal electric field and react with the etching solution, thereby etching the second surface S2 of the semiconductor substrate 100. In other words, not the first conductive semiconductor layer 113 that is subject to etching, but the second surface S2 of the semiconductor substrate 100 is etched away. Accordingly, due to the movement of electrons along the internal electric field, the first surface S1 of the semiconductor substrate 100 lacks electrons that participate in the reaction, and thus, etching of the first conductive semiconductor layer 113 is delayed. Furthermore, as an etching reaction is actively performed on the second surface S2 of the semiconductor substrate 100, an etching rate decreases at the first surface S1 of the semiconductor substrate 100 due to a Galvanic effect, and thus, etching is further delayed.

FIG. 5B schematically illustrates a distribution of electrons when the capping layer 150 is formed on the second surface S2 of the semiconductor substrate 100. Referring to FIG. 5B, as the capping layer 150 is formed on the second surface S2 of the semiconductor substrate 100, leakage of electrons through the second surface S2 of the semiconductor substrate 100 may be prevented. Thus, a sufficient amount of electrons participate in the reaction in the first surface S1 of the semiconductor substrate 100; that is, the etching of the first conductive semiconductor layer 113, may be secured. When FIG. 5A and FIG. 5B are compared with each other, it can be seen that a greater number of electrons exist in the first conductive semiconductor layer 113 due to the coating of the capping layer 150.

FIG. 5B is an energy band diagram when the capping layer 150 is formed on the second surface S2 of the semiconductor substrate 100. Referring to FIG. 5B, an internal electric field is formed between the n-type doped semiconductor substrate 100 and the p-type doped first conductive semiconductor layer 113 according to a p-n junction. However, since the capping layer 150 forms an electric potential barrier on the second surface S2 of the semiconductor substrate 100, the reaction between the electrons and the etching solution may be prevented. Accordingly, the leakage of electrons through the second surface S2 of the semiconductor substrate 100 is prevented and thus a sufficient amount of electrons for the etching of the first conductive semiconductor layer 113 may be secured.

Quantitatively speaking, a relatively low etch rate of about 15 Å/min is observed in wet etching without the capping layer 150. However, in wet etching with the capping layer 150, a relatively high etch rate of about 50 Å/min is observed with the same etching solution.

The capping layer 150 may include an insulator having a large band gap between a conduction band (Ec) and a valence band (Ev) to form an electric potential barrier on the second surface S2 of the semiconductor substrate 100. In detail, the capping layer 150 may include an insulator having a band gap of 3.0 eV or more. Alternatively, the capping layer 150 may include a material having a small work function, for example, a material having a work function of 5.0 eV or less.

In the present embodiment, the capping layer 150 may include a silicon oxide ($SiO_x$) layer or a silicon nitride ($SiN_x$) layer. The capping layer 150 may be formed in the form of a single layer or a combined layer of two or more layers.

Figure 6:
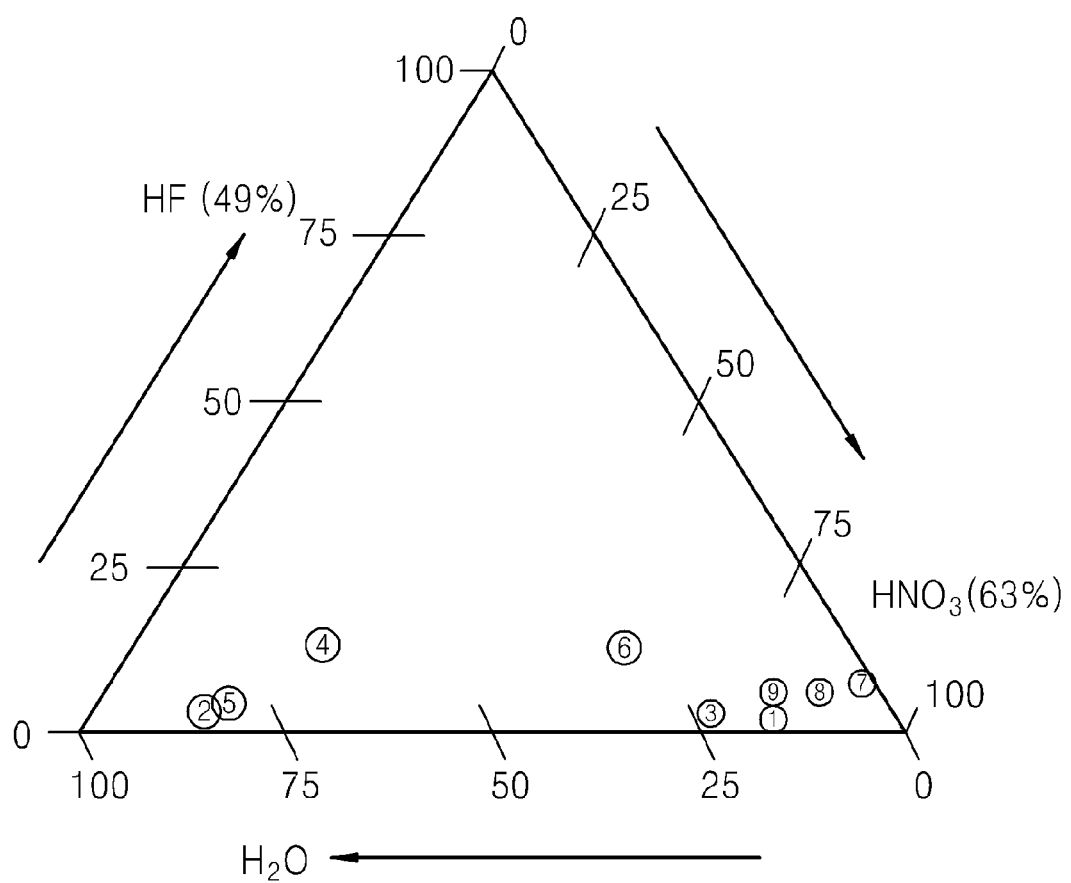
FIG. 6 illustrates a mixture rate of an HNA etching solution.

A mixture rate of the etching solution applied in the wet etching of the first conductive semiconductor layer 113 is described below. FIG. 6 illustrates a mixture rate of an HNA etching solution. In FIG. 6, three sides forming a triangle indicate mixture rates of three components of an HF solution, an $HNO_3$ solution, and $H_2O$ (DI water). The HF solution is diluted at 49 wt % and the $HNO_3$ solution is diluted at 63 wt %. The HF solution, the $HNO_3$ solution, and $H_2O$ indicate a mixture rate of about 0 wt % to about 100 wt % along each side in units of weight percentages. Etching solutions ① to ⑨ with different mixture rates are shown on the triangle.

The following Table 1 shows detailed mixture rates of the etching solutions ① to ⑨ and whether etching is performed.

TABLE 1

| | HF (%) | $HNO_3$ (%) | $H_2O$ (%) | Total $H_2O$ (%) | Etching performed (hours) |
|---|---|---|---|---|---|
| ① | 2 | 82 | 16 | 47.4 | X (3) |
| ② | 2 | 16 | 82 | 88.9 | X (3) |
| ③ | 3 | 73 | 24 | 52.5 | X (3) |
| ④ | 14 | 14 | 72 | 83.3 | X (3) |
| ⑤ | 3 | 16 | 81 | 88.5 | X (3) |
| ⑥ | 11 | 33 | 56 | 73.8 | X (3) |
| ⑦ | 9 | 91 | 0 | 38.3 | ○ (2) |
| ⑧ | 8 | 84 | 8 | 43.2 | ○ (2) |
| ⑨ | 8 | 77 | 15 | 47.6 | ○ (2) |

Whether etching is performed is determined according to whether a porous surface is formed in the first conductive semiconductor layer 113 that is exposed to the etching solution for a predetermined time or not. In other words, for etching solutions ⑦, ⑧, and ⑨, since a porous surface is formed in the first conductive semiconductor layer 113 exposed to the etching solution for about 2 hours, it is determined that etching has been performed. For etching solutions ① to ⑥, since a porous surface is not observed after exposure for three hours, it is determined that etching has not been performed. As a result, among the HNA solutions in Table 1, etching seems to be smoothly performed when a mixture rate of $HNO_3$ is high and a mixture rate of $H_2O$ is low.

In detail, etching can be performed when the mixture rate of $HNO_3$ is 75 wt % or more, in particular, 77 wt % or more, and when the mixture rate of $H_2O$ (DI water) is 15 wt % or less, in particular, 10 wt % or less.

In Table 1, the mixture rate of $H_2O$ means a mixture rate with the HF solution and the $HNO_3$ solution. Since the HF solution and the $HNO_3$ solution are respectively diluted at 49 wt % and 63 wt %, a total mixture rate of $H_2O$ indicates a total mixture rate of $H_2O$ considering the dilution rates of the HF solution and the $HNO_3$ solution, that is, a total mixture rate of $H_2O$ considering $H_2O$ that forms 51 wt % of the HF solution and 37 wt % of the $HNO_3$ solution. In terms of the total mixture rate of $H_2O$, etching may be performed at 50 wt % or less.

Figure 7A:
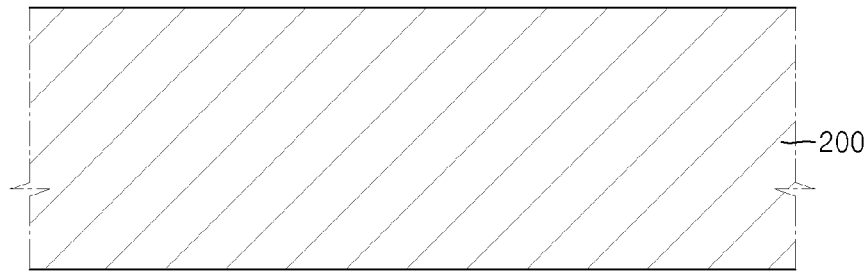
FIGS. 7A through 7O are cross-sectional views illustrating a method of manufacturing a photoelectric device, according to an embodiment of the present disclosure.
Figure 7B:
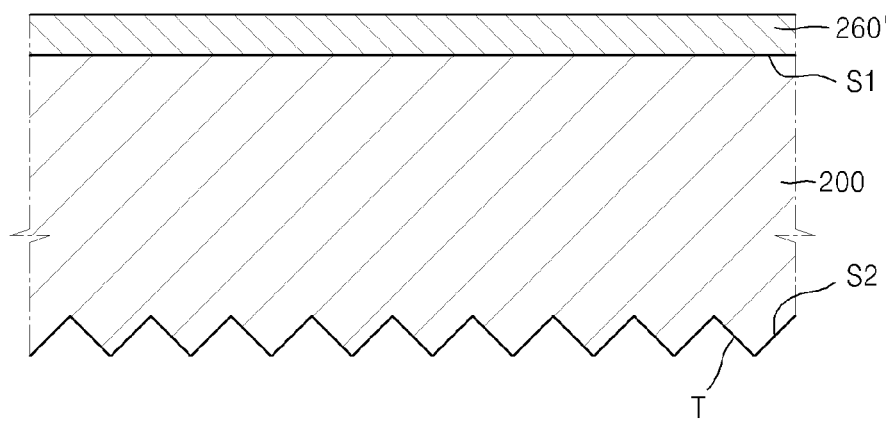
Figure 7C:
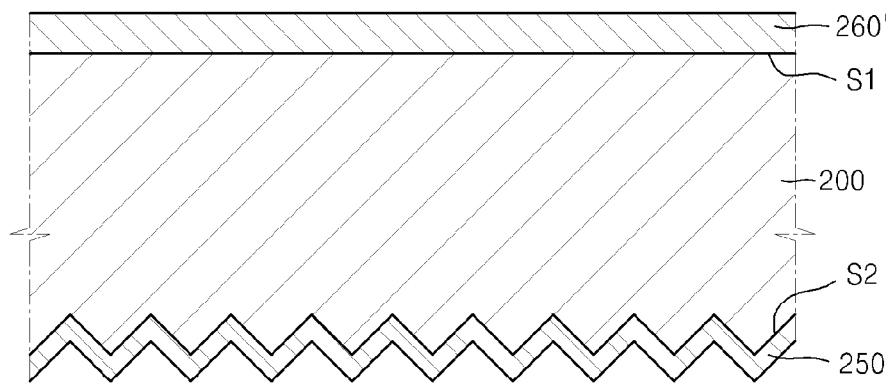
Figure 7D:
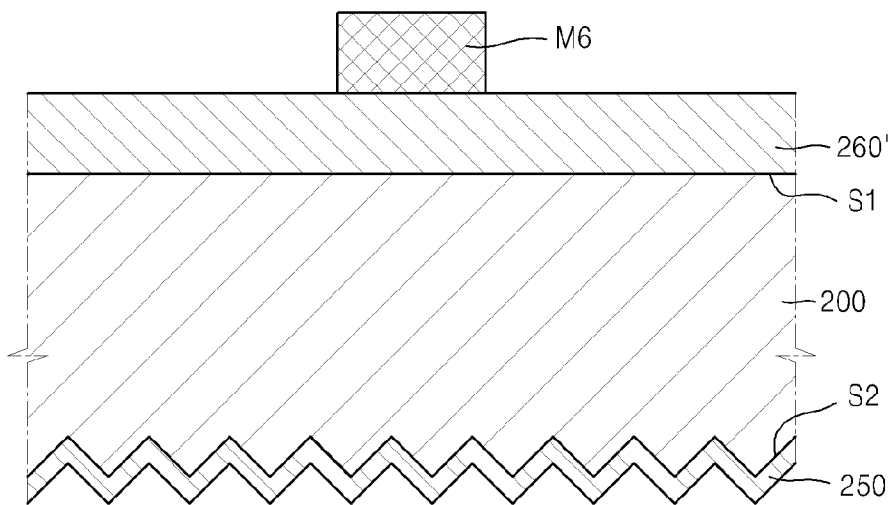
Figure 7E:
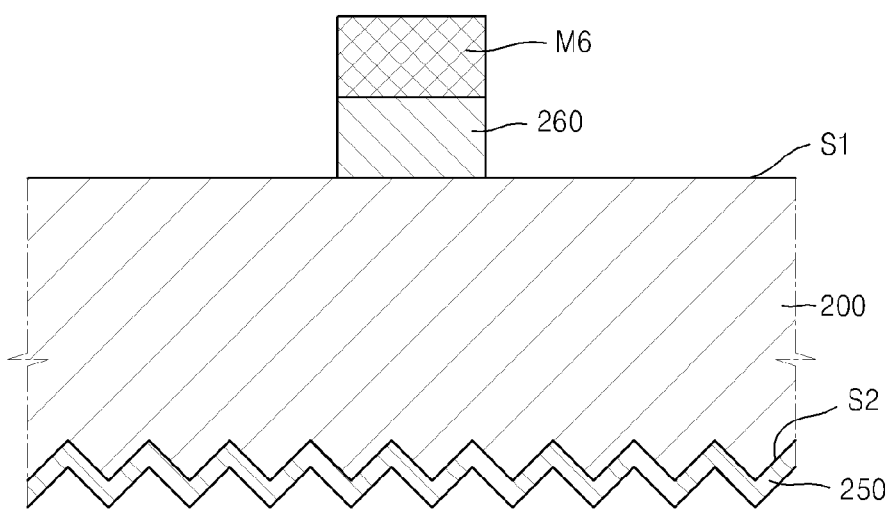
Figure 7F:
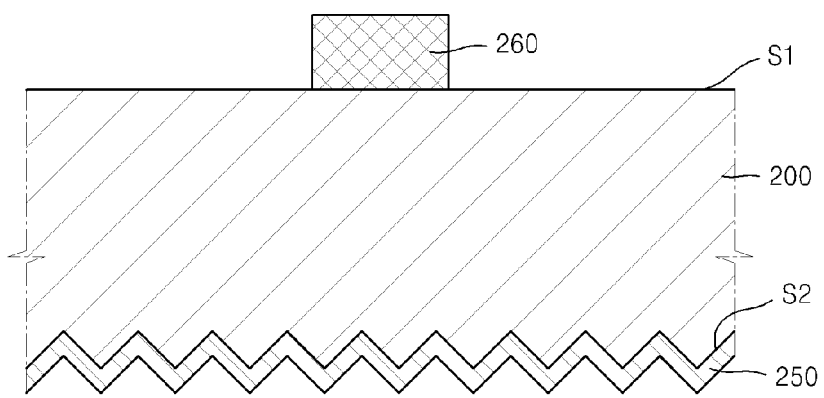
Figure 7G:
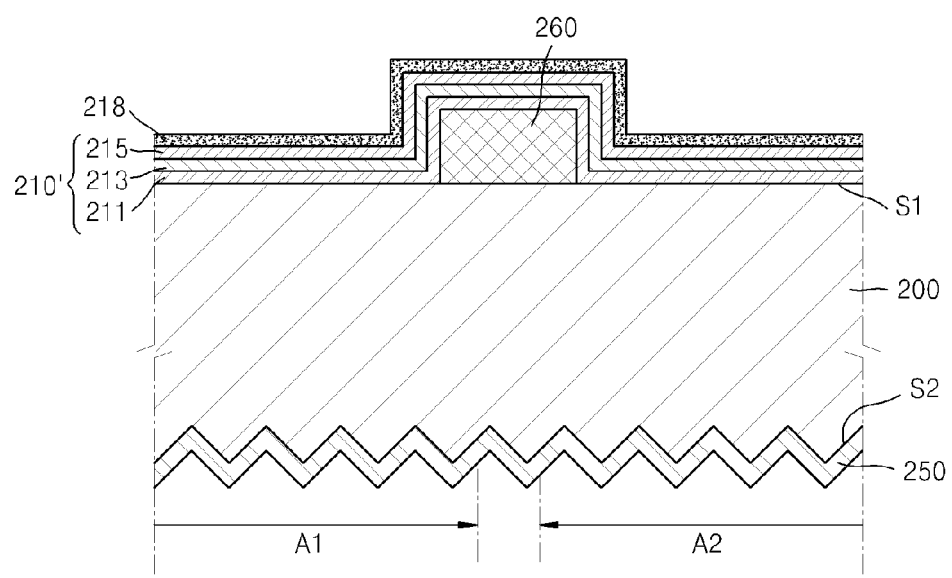
Figure 7H:
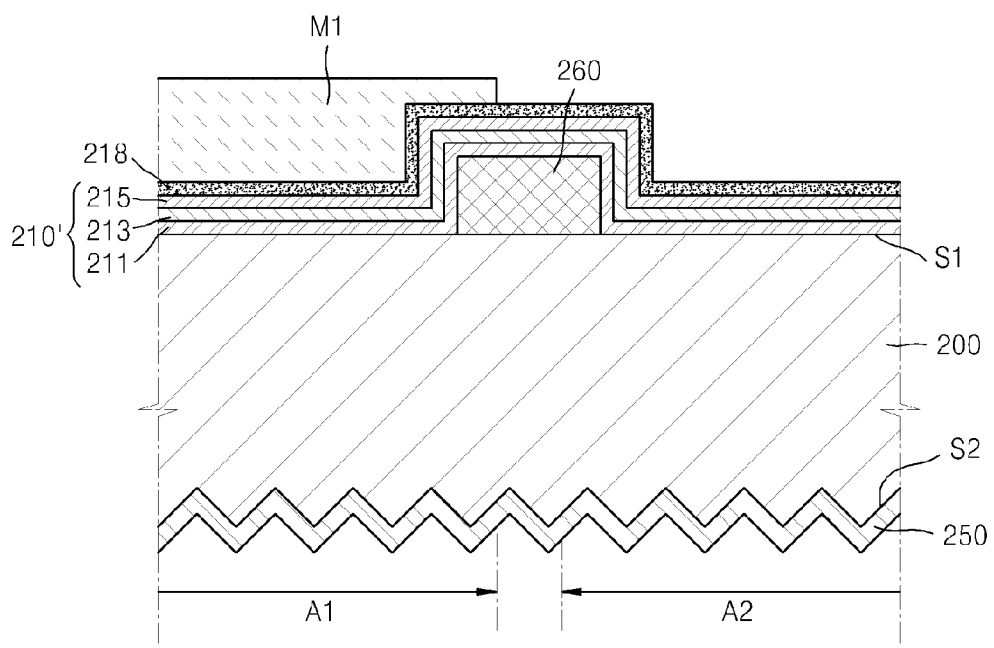
Figure 7I:
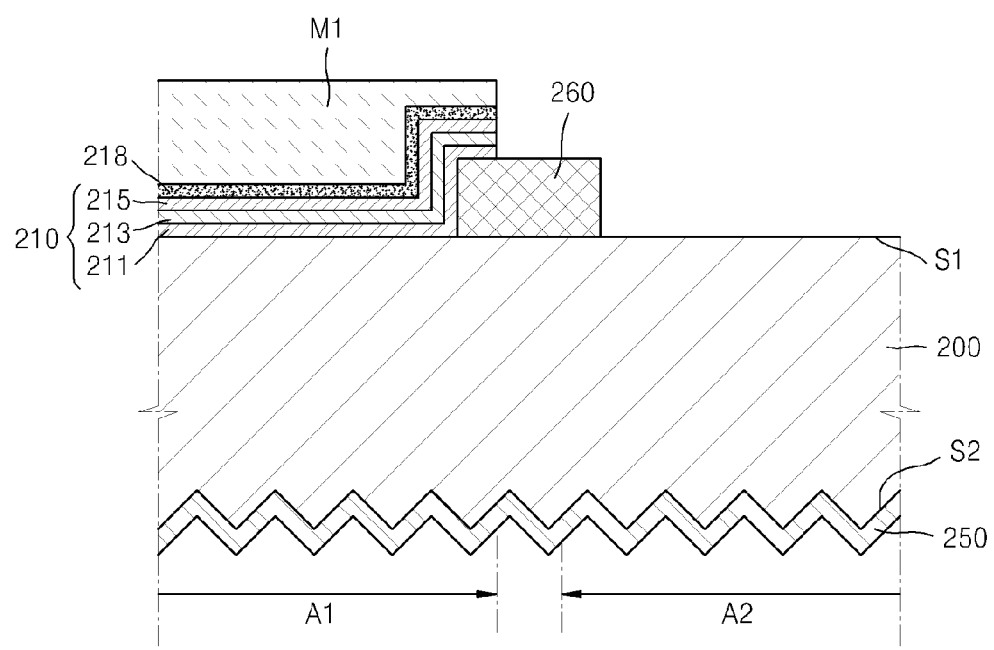
Figure 7J:
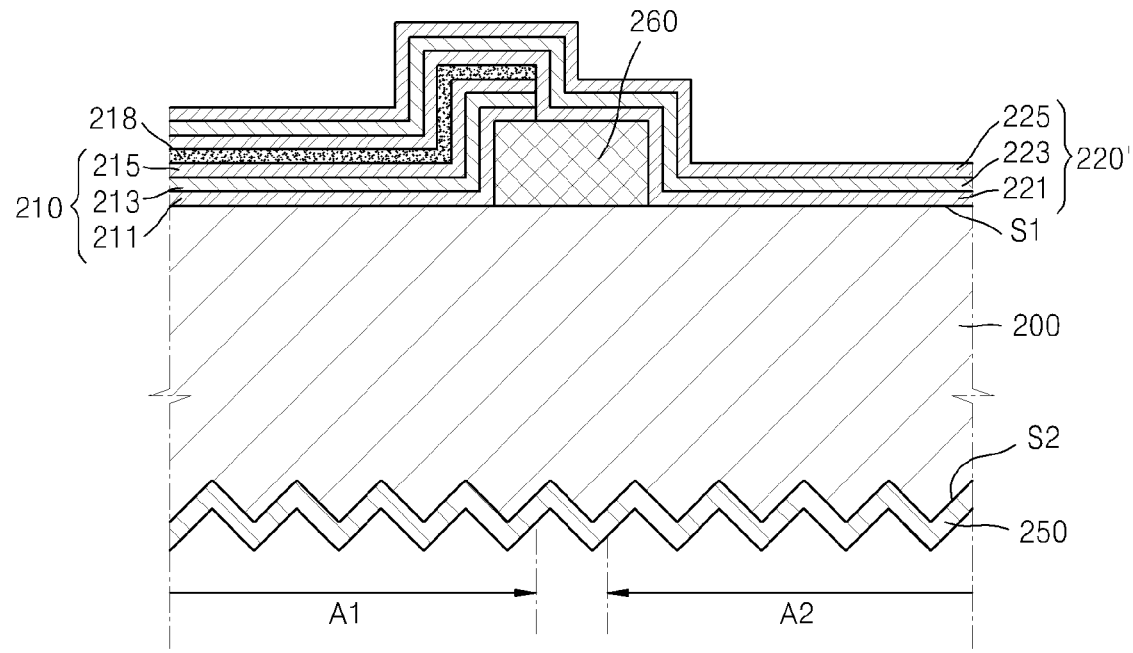
Figure 7K:
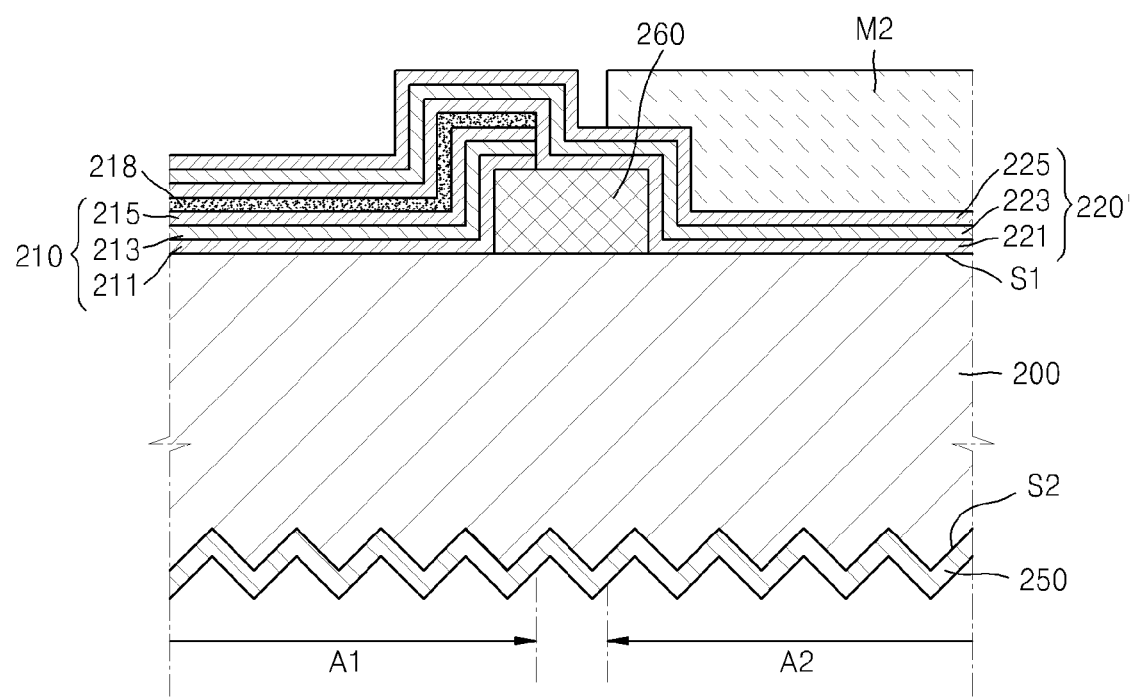
Figure 7L:
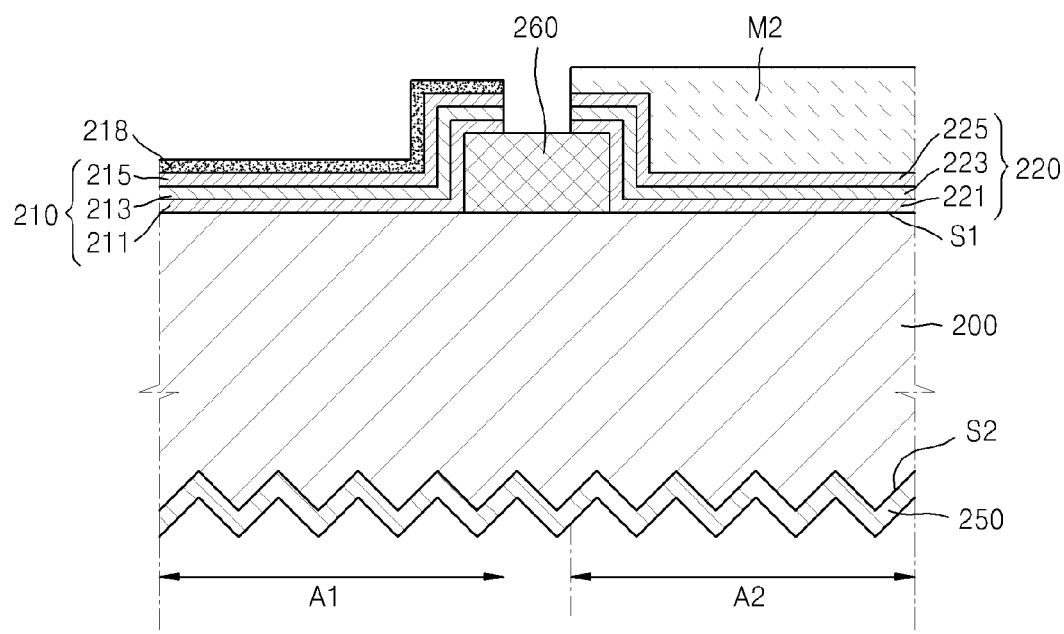
Figure 7M:
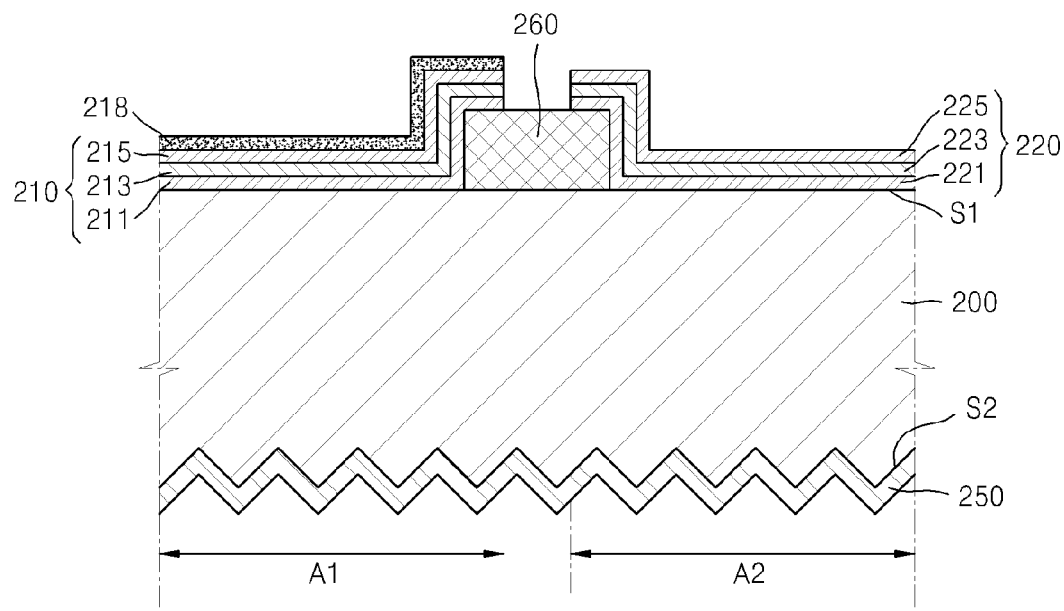
Figure 7N:
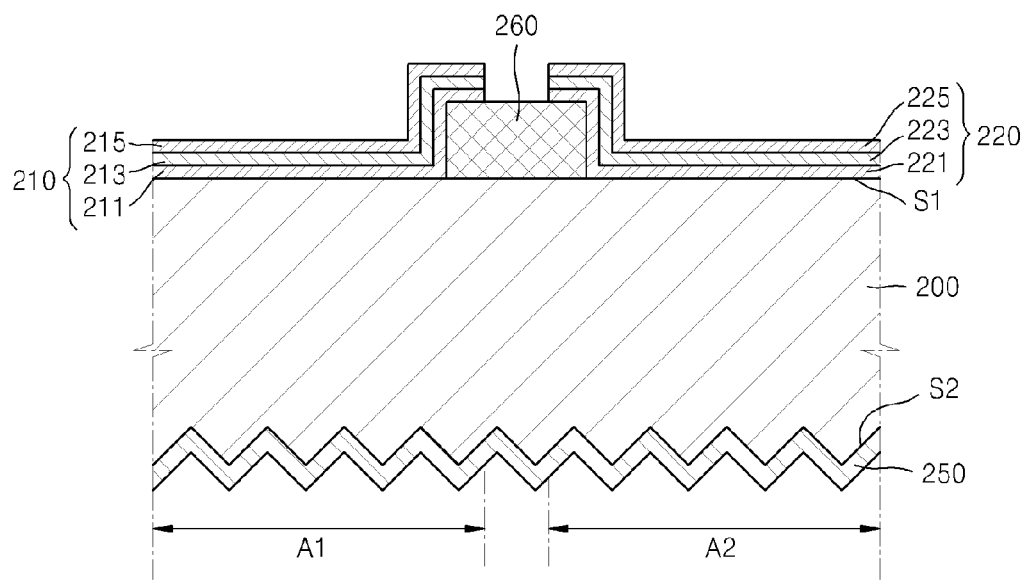
Figure 7O:
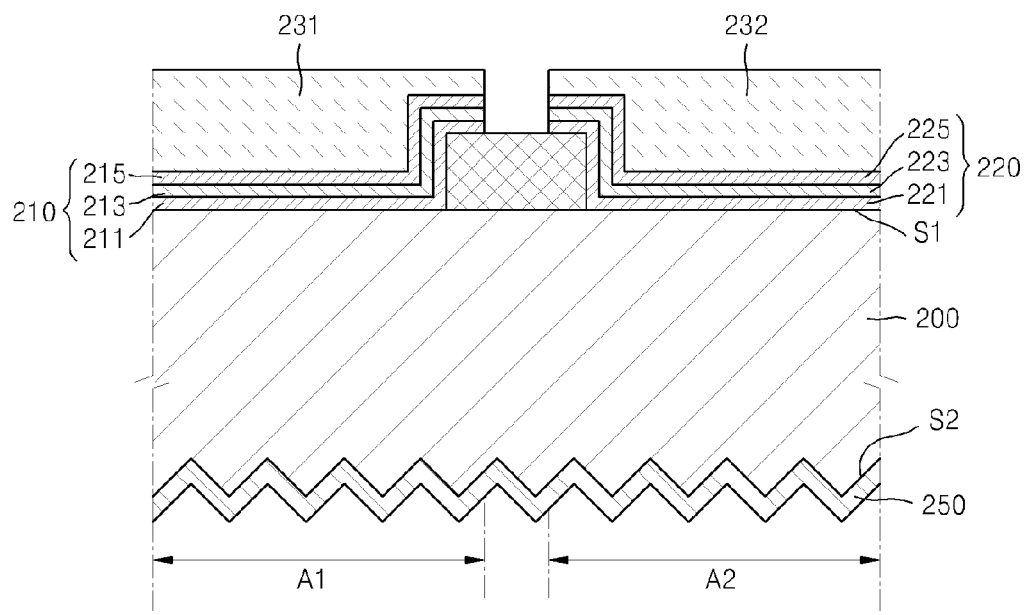

FIGS. 7A through 7O are cross-sectional views illustrating a method of manufacturing a photoelectric device, according to an embodiment of the present disclosure. First, referring to FIG. 7A, a semiconductor substrate 200 is prepared. For example, the semiconductor substrate 200 may be an n-type crystal silicon wafer. For example, a washing process using an acidic or alkaline solution may be performed to remove physical or chemical impurities adhering on a surface of the semiconductor substrate 200.

Referring to FIG. 7B, an insulation layer 260' is formed on a first surface S1 of the semiconductor substrate 200. The insulation layer 260' functions as an etch mask during texturing to form an uneven pattern on a second surface S2 of the semiconductor substrate 200 and may be formed of a material having tolerance to a texturing etchant. Also, a remaining part of the insulation layer 260' may form a gap insulation layer 260 through a patterning process that is described below.

For example, the insulation layer 260' may be formed as a silicon oxide ($SiO_x$) layer or a silicon nitride ($SiN_x$) layer, or as a combined layer of an oxide layer and a nitride layer. The insulation layer 260' may be formed by growing an oxide layer by a thermal oxidation method or by depositing an oxide layer or a nitride layer by a chemical vapor deposition (CVD) method.

Referring to FIG. 7B, texturing may be performed on the second surface S2 of the semiconductor substrate 200. The second surface S2 of the semiconductor substrate 200 is etched by using the insulation layer 260' formed on the first surface S1 of the semiconductor substrate 200 as an etch mask. For example, as anisotropic etching is performed on the semiconductor substrate 200 using an alkaline solution such as KOH or NaOH, a texture structure T with an uneven pattern may be formed on the second surface S2 of the semiconductor substrate 200. As mentioned above, the texture structure T according to the disclosure of the present application may include a number of different pattern or unpatterned shaped surfaces.

Referring to FIG. 7C, a capping layer 250 may be formed on the second surface S2 of the semiconductor substrate 200. The capping layer 250 prevents a reaction between the etching solution and the second surface S2 of the semiconductor substrate 200 and activates etching of a first semiconductor stack 210 formed on the first surface S1 of the semiconductor substrate 200 in wet etching that is described below.

The capping layer 250 may be formed of an insulator having a large band gap between a conduction band and a valence band, to form an electric potential barrier on the second surface S2 of the semiconductor substrate 200. In particular, the capping layer 250 may include a silicon oxide ($SiO_x$) layer or a silicon nitride ($SiN_x$) layer. For example, the capping layer 250 may be formed in the form of a single layer of silicon oxide or silicon nitride, or a combined layer of two or more layers including a silicon oxide layer and a silicon nitride layer together.

The capping layer 250 may thus be configured to perform a passivation function to reduce surface recombination loss of the carriers generated in the semiconductor substrate 200 by covering the second surface S2 of the semiconductor substrate 200. Also, the capping layer 250 may be configured to perform an antireflection function to reduce reflectance of incident light and absorb the incident light in the semiconductor substrate 200 as much as possible. For example, by forming the capping layer 250 in form of a silicon oxide ($SiO_x$) layer, a silicon nitride ($SiN_x$) layer, or a hydrogenated silicon nitride layer (SiN:H), the wet etching on the rear surface of the capping layer 250 is facilitated and simultaneously passivation and antireflection effects may be achieved. In another embodiment, the capping layer 250 may be formed as a first layer (not shown) with an additional passivation function and a second layer (not shown) with an additional antireflection function.

In another embodiment, the capping layer 250 may be formed as a separate layer from the passivation layer and/or the antireflection layer. For example, the passivation layer may be formed on the second surface S2 of the semiconductor substrate 200 and the capping layer may be formed on the passivation layer as a separate layer. For example, the passivation layer may be formed of intrinsic a-Si or doped a-Si. For example, the passivation layer may be formed to have the same conductive type as the semiconductor substrate 200, thereby forming a front surface field (FSF). The capping layer 250 may be formed on the passivation layer.

Referring to FIGS. 7D through 7F, the gap insulation layer 260 is formed by patterning the insulation layer 260' on the first surface S1 of the semiconductor substrate 200. For example, an etch mask M6 is formed in a partial area of the insulation layer 260', and a part of the insulation layer 260' not covered by the etch mask M6 is etched and removed. An acidic solution such as HF or $H_3PO_4$ having an etching characteristic to the insulation layer 260' may be used as an etchant. When etching is completed, the etch mask M6 is removed.

Referring to FIG. 7G, a first intrinsic semiconductor layer 211 may be formed on the first surface S1 of the semiconductor substrate 200. The first intrinsic semiconductor layer 211 may be formed over the entire first surface S1 of the semiconductor substrate 200 to also be formed over the gap insulation layer 260. For example, the first intrinsic semiconductor layer 211 may be formed by a CVD method using silane ($SiH_4$) that is a silicon containing gas, or may be formed of a-Si.

Next, a first conductive semiconductor layer 213 is formed on the first intrinsic semiconductor layer 211. For example, the first conductive semiconductor layer 213 may be doped to have p-type conductivity that is opposite to that of the semiconductor substrate 200. In some embodiments, the first conductive semiconductor layer 213 may be formed by a CVD method using a doping gas, for example, $B_2H_6$, with $SiH_4$ as a source.

Next, a first transparent conductive layer 215 is formed on the first conductive semiconductor layer 213. The first transparent conductive layer 215 may be formed of TCO such as ITO, ZnO, and the like by a sputtering or CVD method. As such, the first intrinsic semiconductor layer 211, the first conductive semiconductor layer 213, and the first transparent conductive layer 215 are sequentially formed in this order on the first surface S1 of the semiconductor substrate 200, thereby forming a first semiconductor stack material layer 210'. Then, the first semiconductor stack material layer 210' is patterned by wet etching so that the first semiconductor stack 210 that is selectively formed in the first semiconductor area A1 may be obtained.

Referring to FIG. 7G, an etch stop layer 218 may be additionally formed on the first transparent conductive layer 215. The etch stop layer 218 does not form the first semiconductor stack 210, but instead, may be configured to prevent etching of the first semiconductor stack 210 during patterning of a second semiconductor stack. The etch stop layer 218 may be employed for convenience of manufacturing and may be removed before the final step of a manufacturing process. For example, the etch stop layer 218 may be formed as a titanium-tungsten (TiW) layer by a sputtering method.

Referring to FIGS. 7H and 7I, the first semiconductor stack 210 may be formed by patterning the first semiconductor stack material layer 210' and the etch stop layer 218, which are formed on the first surface S1 of the semiconductor substrate 200. The first semiconductor stack 210 may be selectively formed in the first semiconductor area A1 and in the first semiconductor area A1 including part of the gap insulation layer 260. The first semiconductor stack material layer 210' and the etch stop layer 218, which are formed in the second semiconductor area A2 and in the center portion of the gap insulation layer 260 may be etched and removed.

Wet etching may be used for patterning the first semiconductor stack 210. For example, in the wet etching, the etch mask M1 is employed in the first semiconductor area A1 to remove a portion exposed around the etch mask M1. An acid etching solution such as HNA may be employed as an etchant.

As described above with reference to FIGS. 4B and 5B, in the wet etching, the capping layer 250 formed on the second surface S2 of the semiconductor substrate 200 may activate etching of the first semiconductor stack material layer 210' on the first surface S1, in particular, the first conductive semiconductor layer 213. In more detail, the capping layer 250 may be configured to restrict the reaction between the second surface S2 and the etching solution and may be configured to form an electric potential barrier on the second surface S2 so that the etching reaction of the first conductive semiconductor layer 213 on the first surface S1 may be activated may be activated.

When the wet etching is completed, as illustrated in FIG. 7I, the first semiconductor stack 210 and the etch stop layer 218 are formed, and are patterned to cover the first semiconductor area A1, and the etch mask M1 may be removed.

In the processes of FIGS. 7H and 7I, although layers from the first intrinsic semiconductor layer 211 to the etch stop layer 218 formed on the semiconductor substrate 200 are illustrated as patterned simultaneously, the present disclosure is not limited thereto. For example, the layers may be sequentially patterned in a deposition direction, for example, by patterning the etch stop layer 218 using an etching solution including hydrogen peroxide ($H_2O_2$), patterning the first transparent conductive layer 215 using an acid etching solution such as HCl, $HNO_3$, etc, and patterning the first conductive semiconductor layer 213 and the first intrinsic semiconductor layer 211.

Referring to FIG. 7J, a second intrinsic semiconductor layer 221 may be formed on the first surface S1 of the semiconductor substrate 200. The second intrinsic semiconductor layer 221 may be formed over the entire surface of the semiconductor substrate 200 including the first semiconductor stack 210. For example, the second intrinsic semiconductor layer 221 may be formed by a CVD method using $SiH_4$ that is a silicon containing gas, or may be formed of a-Si.

Next, a second conductive semiconductor layer 223 is formed on the second intrinsic semiconductor layer 221. For example, the second conductive semiconductor layer 223 may be formed to have an n-type conductivity that is the same type as that of the semiconductor substrate 200 and may be formed by a CVD method using a doping gas, for example, $PH_3$, with $SiH_4$ as a source, or may be formed of a-Si.

Next, a second transparent conductive layer 225 is formed on the second conductive semiconductor layer 223. The second transparent conductive layer 225 may be formed of TCO such as ITO, ZnO, and the like. by a sputtering or CVD method. As such, the second intrinsic semiconductor layer 221, the second conductive semiconductor layer 223, and the second transparent conductive layer 225 are sequentially formed in this order on the semiconductor substrate 200, thereby forming a second semiconductor stack material layer 220'. Then, the second semiconductor stack material layer 220' is wet-etched and patterned so that a second semiconductor stack 220 selectively formed in the second semiconductor area A2 is obtained, which is described in further detail below.

Referring to FIGS. 7K through 7M, the second semiconductor stack 220 may be formed by patterning the second semiconductor stack material layer 220' formed on the first surface S1 of the semiconductor substrate 200. The second semiconductor stack 220 may be selectively formed in the second semiconductor area A2 and in the second semiconductor area A2 including part of the gap insulation layer 260. The second semiconductor stack material layer 220' formed in the first semiconductor area A1 and in the center portion of the gap insulation layer 260 may be etched and removed.

Wet etching may be used for patterning the second semiconductor stack material layer 220'. For example, in the wet etching, an etch mask M2 is employed in the second semiconductor area A2 to remove a portion exposed around the etch mask M2. An acid etching solution such as HNA may be employed as an etchant. Also, since the etch stop layer 218 is formed on the first semiconductor stack 210, the first semiconductor stack 210 may be protected to not be etched.

As described above with reference to FIGS. 4B and 5B, in the wet etching, the capping layer 250 formed on the second surface S2 of the semiconductor substrate 200 may activate etching of the second semiconductor stack material layer 220' at the first surface S1. In more detail, the capping layer 250 restricts the reaction between the second surface S2 and the etching solution and forms an electric potential barrier on the second surface S2 so that the etching reaction of the second semiconductor stack material layer 220' may be activated.

For reference, the activation of etching by the capping layer 250 may be effectively achieved in the wet etching of the first conductive semiconductor layer 213 or the second conductive semiconductor layer 223 that is doped to have p-type conductivity. Also, the activation effect may be obtained in the wet etching of the other first conductive semiconductor layer 213 or second conductive semiconductor layer 223 that is doped to have n-type conductivity. This is because the capping layer 250 may be configured to restrict the reaction between the second surface S2 and the etching solution and forms an electric potential barrier on the second surface S2 so that the etching of the first conductive semiconductor layer 213 or the second conductive semiconductor layer 221 on the first surface S1 may be activated as described above with reference to FIGS. 4B and 5B.

In the processes of FIGS. 7K and 7I, although layers from the second intrinsic semiconductor layer 221 to the second transparent conductive layer 225 formed on the semiconductor substrate 200 are illustrated to be patterned simultaneously; the present disclosure is not limited thereto. For example, the layers may be sequentially patterned in a deposition direction, for example, by patterning the second transparent conductive layer 225 using an acid etching solution such as HCl, $HNO_3$, etc, and then patterning the second conductive semiconductor layer 223 and the second intrinsic semiconductor layer 221.

Referring to FIG. 7M, when the wet etching is completed and the etch mask M2 is removed, the second semiconductor stack 220 is formed as a pattern that covers the second semiconductor area A2. The first and second semiconductor stacks 210 and 220 may be alternately arranged on the first surface S1 of the semiconductor substrate 200 in plural.

Referring to FIGS. 7M and 7N, the etch stop layer 218 formed on the first semiconductor stack 210 is removed. For example, the etch stop layer 218 may be removed by using an etching solution including hydrogen peroxide ($H_2O_2$) and the other portions than the etch stop layer 218 may be protected by an etch mask (not shown).

Referring to FIG. 7O, first and second electrodes 231 and 232 are formed on the first and second semiconductor stacks 210 and 220, respectively. The first and second electrodes 231 and 232 are electrically connected to the second semiconductor stacks 210 and 220, respectively, and thus carriers may be drawn to the outside. The first and second electrodes 231 and 232 may include a metal material such as silver (Ag), aluminum (Al), copper (Cu), nickel (Ni), and the like. For example, metal paste is pattern printed by employing screen printing and then the first and second electrodes 231 and 232 may be formed through thermal plasticity.

According to the present disclosure, an etching reaction may be activated during wet etching. Also, since a photoelectric device is manufactured by employing wet etching advantageous to mass production, mass productivity of a photoelectric device may be improved and manufacturing cost may be reduced.

While this invention has been described in connection with what is are presently considered to be practical embodiments, it will be appreciated by those skilled in the art that various modifications and changes may be made without departing from the scope of the present disclosure. It will also be appreciated by those of skill in the art that parts mixed with one embodiment are interchangeable with other embodiments; one or more parts from a depicted embodiment can be included with other depicted embodiments in any combination. For example, any of the various components described herein and/or depicted in the Figures may be combined, interchanged or excluded from other embodiments. With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. Thus, while the present disclosure has described certain exemplary embodiments, it is to be understood that the invention is not limited to the disclosed embodiments, but, on the contrary, is intended to cover various modifications and equivalent arrangements included within the scope of the appended claims, and equivalents thereof.

What is claimed is:

1. A photoelectric device, comprising:
    a semiconductor substrate;
    first and second semiconductor stacks having opposite conductive types, the first and second semiconductor stacks alternately arranged on a first surface of the semiconductor substrate;
    a gap insulation layer formed between the first and second semiconductor stacks;
    an undercut formed in the gap insulation layer; and
    end portions of the first and second semiconductor stacks formed covering a side surface and at least part of an upper surface of the gap insulation layer.

2. The photoelectric device of claim 1, wherein the gap insulation layer comprises a bottom surface facing the first surface of the semiconductor substrate and left and right side surfaces, and wherein the undercut is formed in at least one of the left and the right side surfaces.

3. The photoelectric device of claim 1 further comprising a capping layer formed on a second surface of the semiconductor substrate, the second surface formed opposing and substantially parallel to the first surface.

4. The photoelectric device of claim 3, wherein the capping layer comprises an insulation layer.

5. The photoelectric device of claim 4, wherein the capping layer is formed of at least one of a silicon oxide layer and a silicon nitride layer.

6. The photoelectric device of claim 3, wherein the capping layer is formed on a textured structure formed on the second surface of the semiconductor substrate.

7. The photoelectric device of claim 1, wherein the first semiconductor stack comprises:
    a first intrinsic semiconductor layer formed on the first surface of the semiconductor substrate;
    a first conductive semiconductor layer formed on the first intrinsic semiconductor layer; and
    a first transparent conductive layer formed on the first conductive semiconductor layer.

8. The photoelectric device of claim 1, wherein the second semiconductor stack comprises:
    a second intrinsic semiconductor layer formed on the first surface of the semiconductor substrate;
    a second conductive semiconductor layer formed on the second intrinsic semiconductor layer; and
    a second transparent conductive layer formed on the second conductive semiconductor layer.

9. A method of manufacturing a photoelectric device, the method comprising:
    preparing a semiconductor substrate having first and second surfaces opposing each other;
    forming a capping layer on the second surface of the semiconductor substrate;
    forming a first semiconductor stack material layer on the first surface of the semiconductor substrate;
    patterning the first semiconductor stack material layer by wet etching to form a first semiconductor stack;
    forming a second semiconductor stack material layer on the first surface of the semiconductor substrate where the first semiconductor stack is formed;
    patterning the second semiconductor stack material layer by wet etching to form a second semiconductor stack;
    forming a gap insulation layer on the first surface of the semiconductor substrate; and
    forming end portions of the first and second semiconductor stacks to cover a side surface and at least part of an upper surface of the gap insulation layer.

10. The method of claim 9, wherein the forming the capping layer is performed before the forming the first semiconductor stack.

11. The method of claim 9, wherein the first semiconductor stack material layer comprises a first conductive semiconductor layer doped to have p-type conductivity.

12. The method of claim 9, wherein the capping layer comprises an insulation layer.

13. The method of claim 9, wherein the wet etching comprises an etching solution including a combination of hydrofluoric acid (HF), nitric acid (HNO3), and pure water (DI water) or an etching solution of a combination of hydrofluoric acid (HF), nitric acid (HNO3), and acetic acid (CH3COOH).

14. The method of claim 9, wherein the first and second semiconductor stacks are respectively formed on non-overlapping areas of the first and second semiconductors.

* * * * *